(12) United States Patent
Ruckerbauer et al.

(10) Patent No.: US 7,078,793 B2
(45) Date of Patent: Jul. 18, 2006

(54) SEMICONDUCTOR MEMORY MODULE

(75) Inventors: Hermann Ruckerbauer, Moos (DE); Srdjan Djordjevic, München (DE)

(73) Assignee: Infineon Technologies AG, Munich (DE)

( * ) Notice: Subject to any disclaimer, the term of this patent is extended or adjusted under 35 U.S.C. 154(b) by 123 days.

(21) Appl. No.: 10/927,312

(22) Filed: Aug. 27, 2004

(65) Prior Publication Data
US 2005/0047250 A1    Mar. 3, 2005

(30) Foreign Application Priority Data
Aug. 29, 2003  (DE) ................ 103 39 891
Aug. 20, 2004  (DE) ............. 10 2004 040 459

(51) Int. Cl.
*H01L 23/02* (2006.01)

(52) U.S. Cl. .............. 257/686; 365/51; 365/52; 365/63; 365/226

(58) Field of Classification Search ............. 365/51, 365/52, 63, 226; 257/686
See application file for complete search history.

(56) References Cited

U.S. PATENT DOCUMENTS

| | | | |
|---|---|---|---|
| 6,233,650 B1 | 5/2001 | Johnson et al. | |
| 6,349,050 B1 * | 2/2002 | Woo et al. | ............ 365/51 |
| 6,530,033 B1 | 3/2003 | Raynham et al. | |
| 2003/0061447 A1 | 3/2003 | Perego et al. | |

* cited by examiner

*Primary Examiner*—Mai-Huong Tran
(74) *Attorney, Agent, or Firm*—Edell, Shapiro & Finnan, LLC

(57) ABSTRACT

A semiconductor memory module includes a wiring board in or on which at least a number of data line runs are conducted in a respective width of k bits and which exhibits a number of memory ranks which in each case have n memory chips, and at least one signal driver/control chip (hub), a k-bit-wide data line run in each case connecting a memory chip from each memory rank to the signal driver/control chip (hub) and four or eight memory ranks in each case being arranged distributed on the top and bottom of the wiring board along the associated data line run in such a manner that, in operation, the load is distributed along the respective data line run.

34 Claims, 10 Drawing Sheets

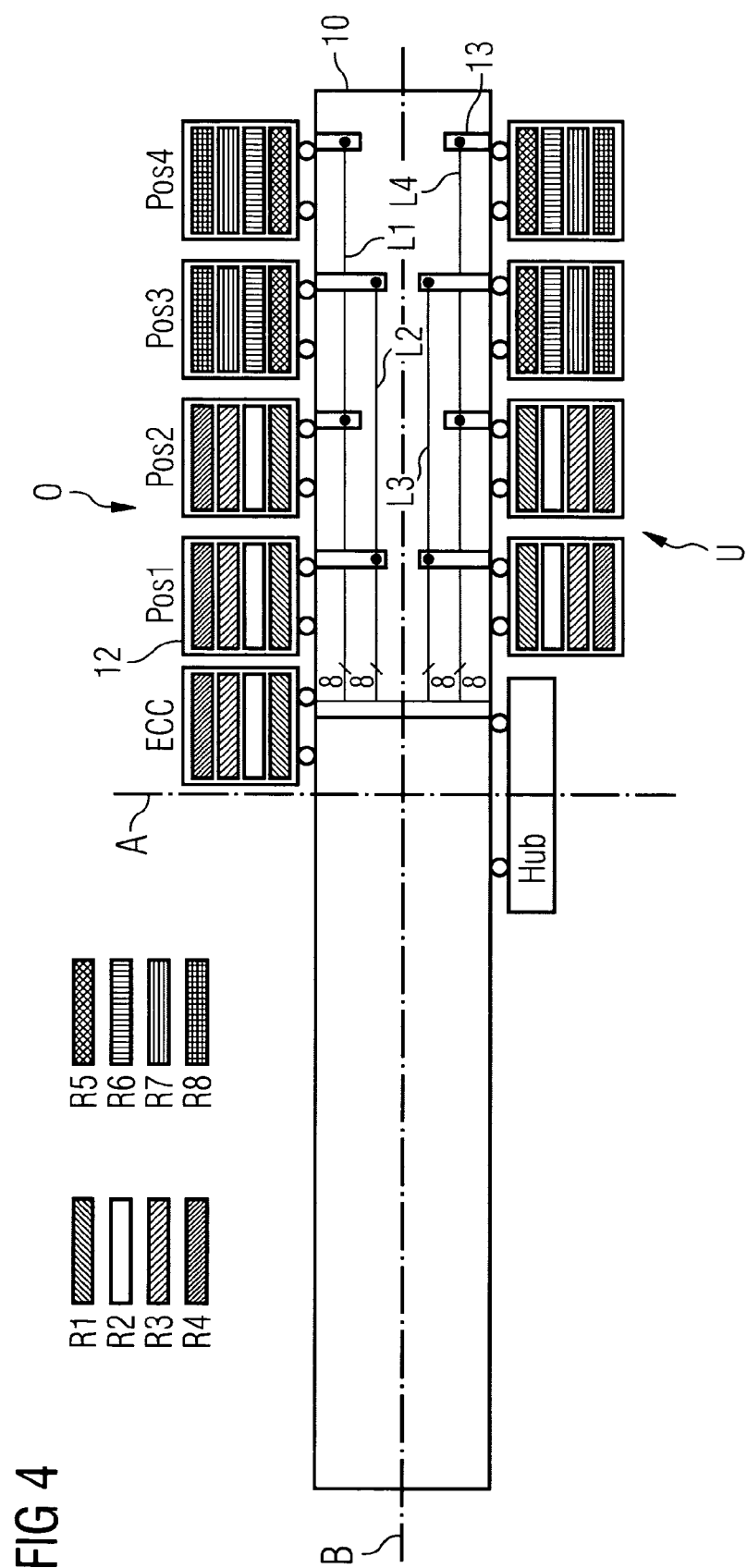

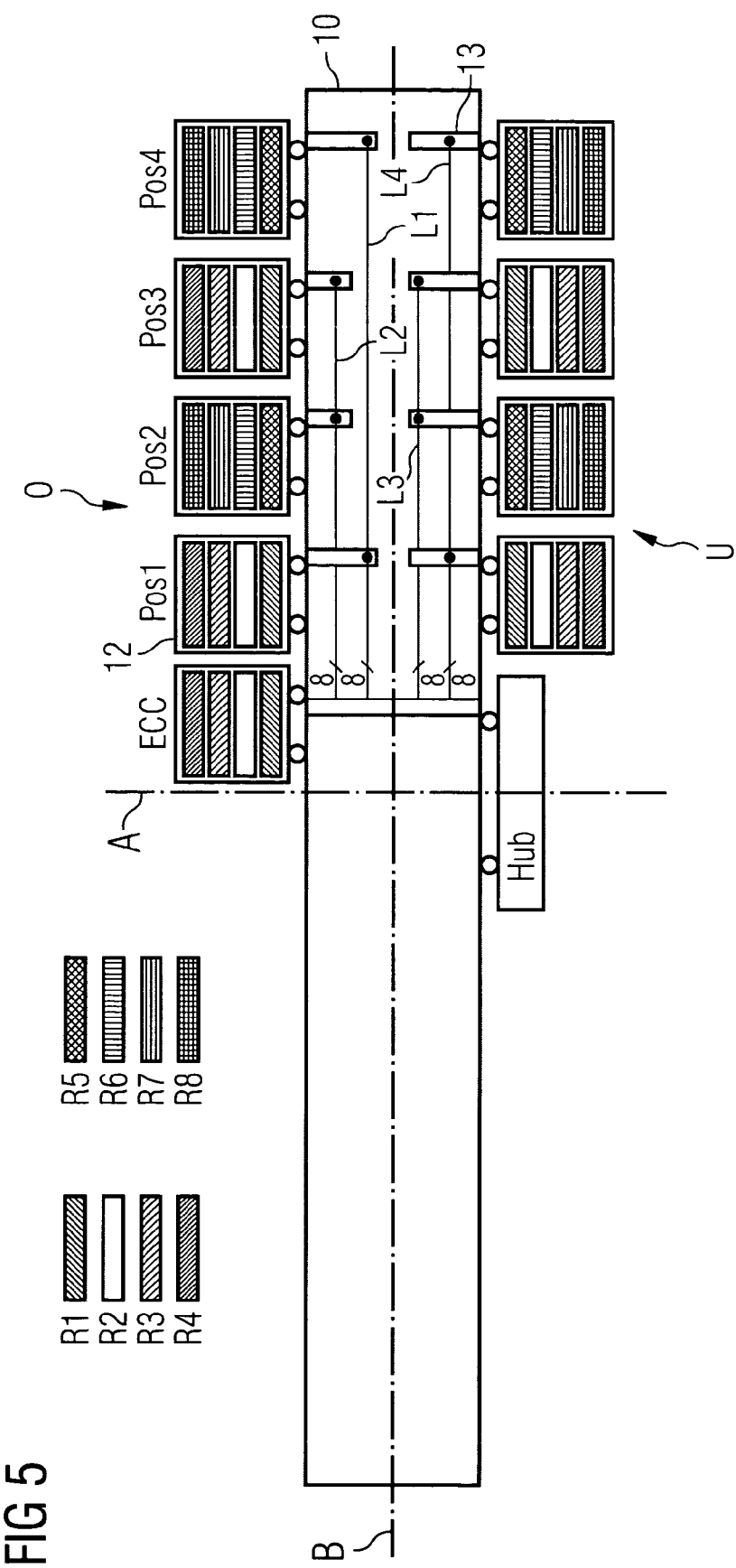

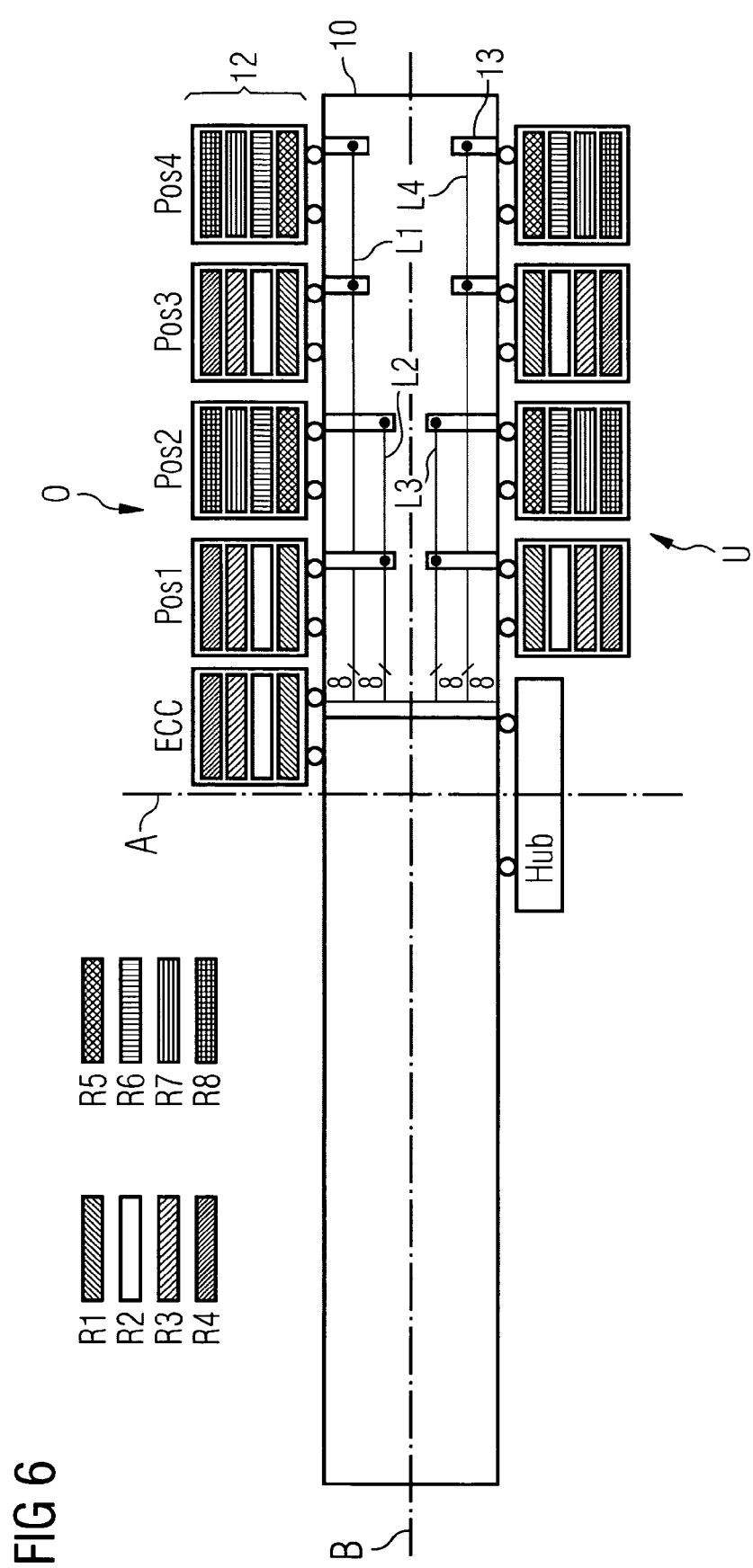

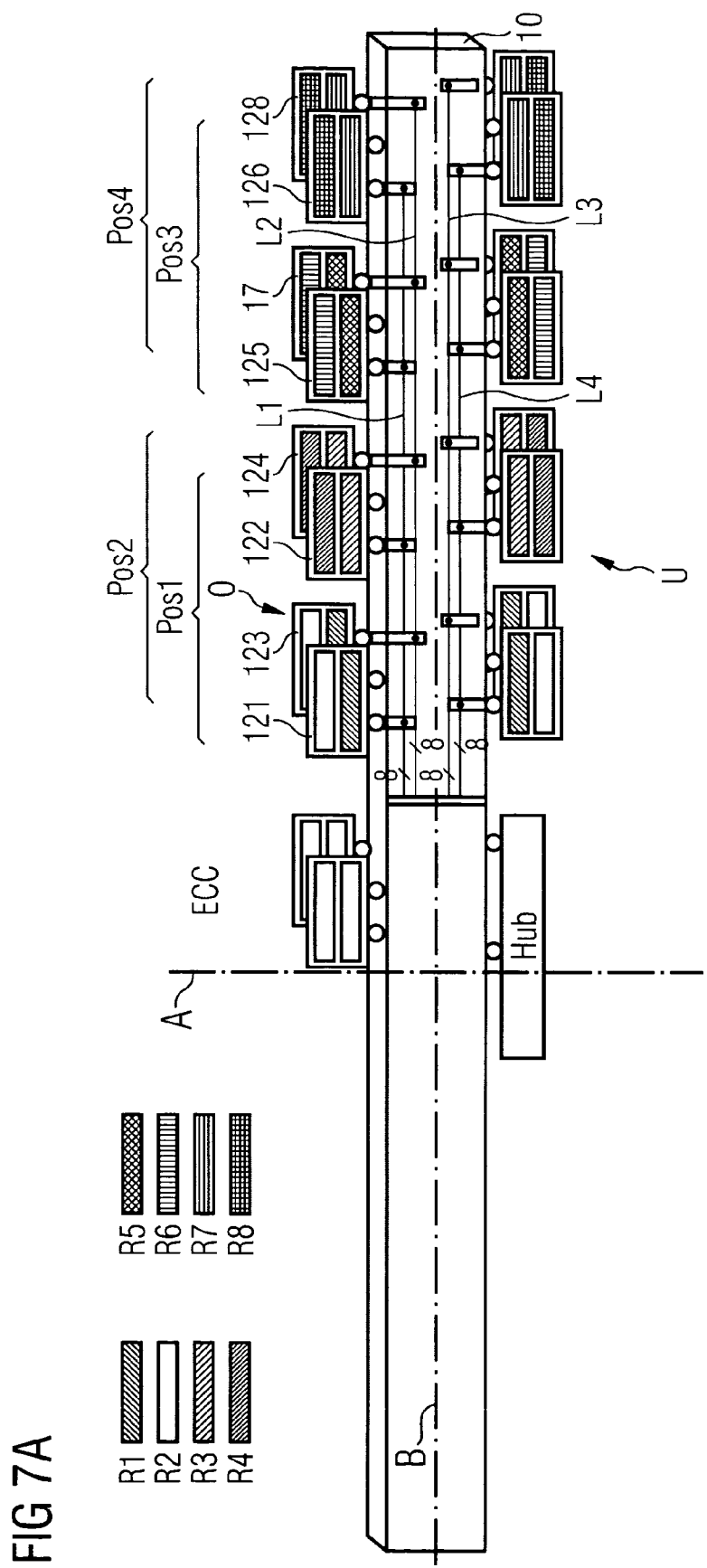

FIG 8

| Pos | Tabelle 1 | | | | 8bit-Datenleitungszüge DQ | |
|---|---|---|---|---|---|---|
| | 1 | 2 | 3 | 4 | | |
| R | 1,2 | 1,2 | 3,4 | 3,4 | | |
| | | * | | * | L₁ | O |
| | * | | * | | L₂ | |
| R | 1,2 | 1,2 | 3,4 | 3,4 | | |
| | | * | | * | L₃ | U |
| | * | | * | | L₄ | |

\* Verbindungspunkte mit Speicherchip-Paaren

FIG 9

| Pos | Tabelle 2 | | | | 8bit-Datenleitungszüge DQ | |
|---|---|---|---|---|---|---|
| | 1 | 2 | 3 | 4 | | |
| R | 1,2 | 1,2 | 3,4 | 3,4 | | |
| | * | | | * | L₁ | O |
| | | * | * | | L₂ | |
| R | 1,2 | 1,2 | 3,4 | 3,4 | | |
| | | * | * | | L₃ | U |
| | * | | | * | L₄ | |

\* Verbindungspunkte mit Speicherchip-Paaren

FIG 10

| Pos | Tabelle 3 | | | | 8bit-Datenleitungszüge DQ | |
|---|---|---|---|---|---|---|
| | 1 | 2 | 3 | 4 | | |
| R | 1,2 | 3,4 | 1,2 | 3,4 | | |
| | | | * | * | L₁ | O |
| | * | * | | | L₂ | |
| R | 1,2 | 3,4 | 1,2 | 3,4 | | |
| | * | * | | | L₃ | U |
| | | | * | * | L₄ | |

\* Verbindungspunkte mit Speicherchip-Paaren

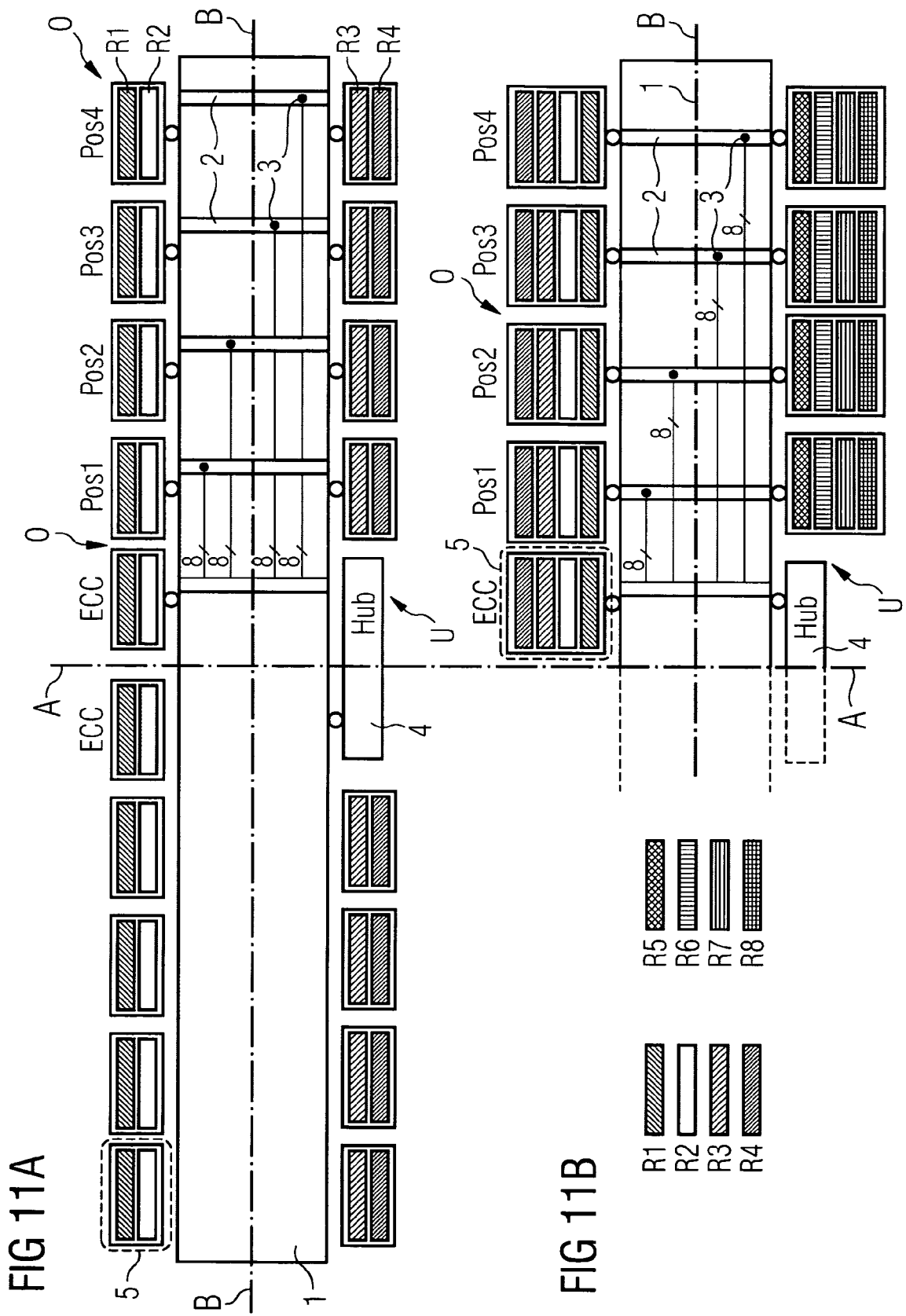

SEMICONDUCTOR MEMORY MODULE

CROSS REFERENCE TO RELATED APPLICATIONS

This application claims priority under 35 USC §119 to German Application No. 103 39 891.0, filed on Aug. 29, 2003, and titled "Semiconductor Memory Module," and to German Application No. DE 10 2004 040 459.3, filed Aug. 20, 2004, and titled "Semiconductor Memory Module," the entire contents of which are hereby incorporated by reference.

FIELD OF THE INVENTION

The invention relates to a semiconductor memory module including a wiring board in or on which at least a number of data line runs are conducted in a respective width of k bits, and, more particularly, the memory board of the semiconductor memory module exhibits a number of memory ranks which in each case include n memory chips, and at least one signal driver/control chip (hub), a k-bit-wide data line run in each case connecting a memory chip from each memory rank to the signal driver/control chip (hub).

BACKGROUND

In a "buffered DIMM", i.e., a DIMM semiconductor memory module on which there is a signal driver/control chip (hub) as is currently planned for DDR2 and DDR3 semiconductor memory modules, two ranks per semiconductor memory module are normally arranged. A rank comprises the quantity of memory chips, which is necessary for occupying the bus width to the controller, which can be a processor, a chip set or also the signal driver/control chip on the semiconductor memory module. The bus width is normally 64 bits (72 bits incl. ECC). With this organization, 16 (or 18 with ECC) chips with 4 bits data width or 8 (or 9 with ECC) chips with 8 bits data width are needed for one rank.

A maximum of two ranks have been used on one DIMM. In the new "buffered DIMMs," in which the data lines DQ from the controller are also buffered, it makes sense to implement, in deviation from the previous principle, a DIMM including 4 ranks with eight-bit-wide memory chips. Among other things, the required power of the DRAM memory chips plays an important role here. The problem with a DIMM with four ranks is that the load of four individual chips (two chips stacked above one another) occurs per DQ line. Due to this high loading, the planned high speeds, for example, 800 MBit/s, can only be achieved with difficulty.

A ×4-based DIMM with two ranks has 18 stacked chips. In each "stacked device", two 4-bit-wide chips are installed. The lower 18 chips closer to the wiring board form one rank and the outside (upper) 18 chips form a second rank. If this arrangement is expanded to a ×8-based DIMM with 4 ranks, a structure shown diagrammatically in the FIG. 11A is obtained. The structure shown in FIG. 11A is symmetric to a center plane of symmetry A which divides a wiring board 1 into a left- and right-hand half. At equally spaced-apart positions Pos1, Pos2, Pos3, Pos4 to the left and to the right of the center plane of symmetry A, in each case two memory chips 5 are stacked above one another (stacked devices) on the top and bottom O, U of the DIMM module. In addition, there are ECC chips at position O (which are not designated in greater detail). The memory chips of the stacked devices are connected to a signal driver/control chip (hub) 4 via a number of wiring planes of the wiring board 1. Of the lines connecting the memory chips to the hub chip, 8-bit-wide data line runs are shown here, which are connected to the stacked-up memory chips at junction points designated by 3 inside vias 2 which pass through the entire wiring board 1. A first 8-bit-wide data line run leads to a first and second memory chip pair in the position Pos1 next to the plane of symmetry A, in each case on the top O and bottom U of the wiring board 1. In the same manner, a second to fourth 8-bit-wide data line run connects second, third and fourth memory chip pairs in each case on the top and bottom O, U of the wiring board 1 to the hub chip 4. As mentioned, four ranks R1–R4 are provided on this DIMM module. The chips of the first and second rank R1, R2 are arranged on the top O of the wiring board 1 according to FIG. 11A. The chips of the third and fourth rank R3, R4 being arranged on the bottom U of the wiring board 1. Per rank, these are eight memory chips, apart from the two ECC chips and the hub chip 4, which have an 8-bit data organization.

FIG. 11B shows a diagrammatic side view of an extension of the concept shown in FIG. 11A, which provides eight ranks R1–R8 and X8 memory chips with four memory chips stacked in them (the side to the left of the center plane of symmetry A has been omitted for simplification since, of course, it is symmetric to the right-hand side).

In these embodiments according to FIGS. 11A and 11B, the total load is bunched at one point at the end of a DQ line. Due to the high capacitive load, a very poor edge steepness, and thus a small eye opening, is thus achieved. By reducing the impedance of the conductor track, for example by widening it, this effect could be reduced. However, the widening of the conductor tracks needed for this is very difficult or even impossible since they would have to be widened to such an extent that a layout can only be made with difficulty or at higher costs since, for example, additional wiring planes of the wiring board are needed.

A semiconductor memory module has the memory ranks distributed on the top and bottom of the wiring board for thermal reasons. Two memory chips on the front and back of a memory module are in each case connected by a data line run, called a channel. The memory module has four data line runs which in each case connect two memory chips on the front and two memory chips on the back of the memory module.

Also known is to arrange a semiconductor memory modules with approximately equal spacing along a databus.

A semiconductor memory module which, in comparison with conventional semiconductor memory modules, can allow a higher speed with a simple without additional added costs is desirable.

SUMMARY

By distributing the associated DRAMs, an improved signal quality and faster speed is possible. In the structure of the memory module proposed, it is no longer two or four ranks which are used for each side, as explained previously in relation to FIGS. 11A and 11B, all ranks are distributed.

A semiconductor memory module has memory ranks arranged distributed, i.e., distributed along the respective data line run such that, in operation, the load is distributed along the respective data line run.

The memory chips are, for example, DRAM chips and the semiconductor memory module is, for example, a DIMM module. In this exemplary semiconductor memory module, the respective bit width can be k=8. Eight memory chips are arranged per rank and the number of data line runs being 8, for example. Using this concept, for example, four or even eight ranks can be arranged distributed on the semiconductor memory module.

With this structure of the data memory module, a data line run (DQ) is conducted on one side of the semiconductor memory module. Moreover, no through-plated holes are needed for conducting the respective data line run.

The load, which has hitherto been bunched at the end of a DQ line and disturbs the signal integrity, can be distributed over the length of the data line run DQ and compensated for by a "loaded transmission line" concept. In this "loaded transmission line" concept, the input capacity of a memory chip is used such that the impedance is matched due to the additional capacitive load on the transmission line. In the state of the art, the normal conductor track impedance would usually be increased by reducing the conductor track width over a particular length by the DRAM ball of the "ball grid array". Due to the capacitive load of the DRAM contact, a passing wave again sees the original lower impedance. The capacitive load of a DRAM can be embedded into the transmission line.

The structure of the semiconductor circuit module, the load at the end of the DQ line is relatively lower. In the area in which the DRAM contacts are located, routing is possible with a relatively lower conductor bandwidth and a relatively low impedance is still obtained.

BRIEF DESCRIPTIONS OF THE FIGURES

The above and further features of the invention are explained in greater detail in exemplary embodiments in the description following, which refers to the attached drawing figures. In detail, the drawing figures show in:

FIG. 1 diagrammatically illustrates a first exemplary embodiment of a semiconductor memory module according to the invention with four ranks;

FIG. 2 diagrammatically illustrates a second exemplary embodiment of a semiconductor memory module according to the invention with four ranks;

FIG. 3 diagrammatically illustrates a third exemplary embodiment of a semiconductor memory module according to the invention with four ranks;

FIG. 4 diagrammatically illustrates a fourth exemplary embodiment of a semiconductor memory module according to the invention, with eight ranks;

FIG. 5 illustrates a fifth exemplary embodiment of a semiconductor memory module according to the invention, with eight ranks;

FIG. 6 illustrates a sixth exemplary embodiment of a semiconductor memory module according to the invention, with eight ranks;

FIGS. 7A and 7B illustrate in a diagrammatic side view and diagrammatic top view, a seventh exemplary embodiment of a semiconductor memory module according to the invention, with eight ranks;

FIGS. 8, 9 and 10 are various tables for further explanation of the first to third exemplary embodiments of the invention; and FIGS. 11A and 11B illustrate the previously explained conventional designs of a semiconductor memory module with stacked semiconductor memory chip.

DETAILED DESCRIPTION

In general, in a semiconductor memory module according to the invention, memory chips on the top and bottom O, U of the wiring board are arranged in positions which in each case have the same distance from one another, such that two or four memory chips with different ranks are stacked above one another on the top O and bottom U in each position. These stacked memory chips are in each case connected to the same data line run.

Due to the skilled arrangement of the memory chips on the top and bottom of the wiring board, a respective data line run is conducted (routed) on one side, i.e., the top or bottom of the wiring board, as a result of which a respective data line run does not need any vias to the other side of the wiring board. In contrast, blind holes with much lower parasitic capacitances are adequate.

Figure 1:
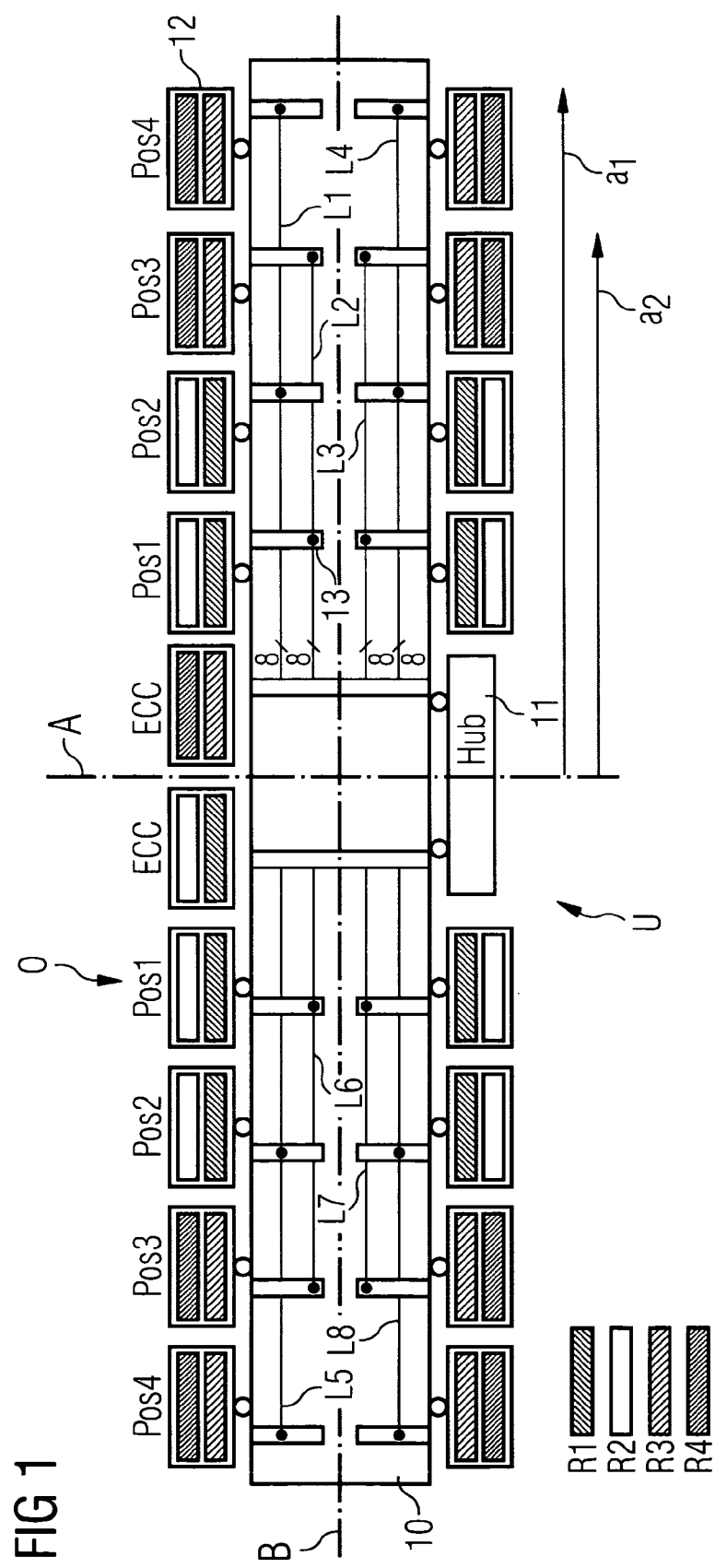

In a first exemplary embodiment, shown diagrammatically in FIG. 1, of a semiconductor memory module according to the invention, the four ranks, R1, R2, R3, R4 are distributed to positions 1 and 3 and 2 and 4.

As in the case of the example explained initially in relation to FIG. 11A of a conventional semiconductor memory module, the semiconductor memory module shown diagrammatically in FIG. 1 is also symmetric to a center plane of symmetry A. On the left and right of this plane of symmetry A, eight memory chips 12, which in each case have a stacked pair of memory chips, are arranged in four identically spaced-apart positions Pos1, Pos2, Pos3, Pos4 on the wiring board 10 (DIMM wiring substrate). In each stacked memory chip 12, the two memory chips are allocated to two different ranks R1 and R2 and R3 and R4. In addition, there are two ECC chips and one signal driver/control chip or hub 11 on the wiring board 10. The memory chip pairs or memory chips 12 are arranged on the top O and on the bottom U of the wiring board 10, such that there is in each case one memory chip pair of in each case the first and second rank R1, R2 in the first and second position Pos1, Pos2 and in each case one memory chip pair of the third and fourth rank R3, R4 in the third and fourth position Pos3 and Pos4. As mentioned, the arrangement is symmetric to the center plane of symmetry A and as can be seen from FIG. 1, it is also symmetric to a second plane of symmetry B intersecting the center of the semiconductor memory module in its longitudinal direction on the top O and bottom U. With this arrangement, the memory chip pairs in the second and fourth position Pos2, Pos4 are in each case connected on the top and bottom O, U and in each case to the left and to the right of the plane of symmetry A in each case to a first, fourth, fifth and eighth data line run L1, L4, L5 and L8. Furthermore, the memory chip pairs or chips in the first and third position Pos1, Pos3 are in each case connected to a second, third, sixth and seventh data line run L2, L3, L6 and L7 in each case on the top and bottom O and U and to the left and to the right of the center plane of symmetry A with this arrangement. a1 indicates a virtual length of the first, fourth, fifth and eighth data line run L1, L4, L5 and L8 and each indicates a virtual length of the second, third, sixth and seventh data line run L2, L3, L6 and L7. It can be seen from FIG. 1 that the load is distributed approximately uniformly over the respective data line runs. As already mentioned, vias through the entire thickness of the wiring board 10 become unnecessary with this arrangement and blind hole connections designated by 13 are sufficient.

The Table 1 shown in FIG. 8 specifies the arrangement shown in FIG. 1 of the memory chips 12 in the positions Pos1–Pos4, the distribution of the ranks R1–R4, and the signal junction points of the respective memory chips to the eight-bit-wide DQ line runs L1–L4 in each case on the top O and bottom U on the right-hand side, i.e., to the right of the center plane of symmetry A of the wiring board 10 in table form.

Figure 2:
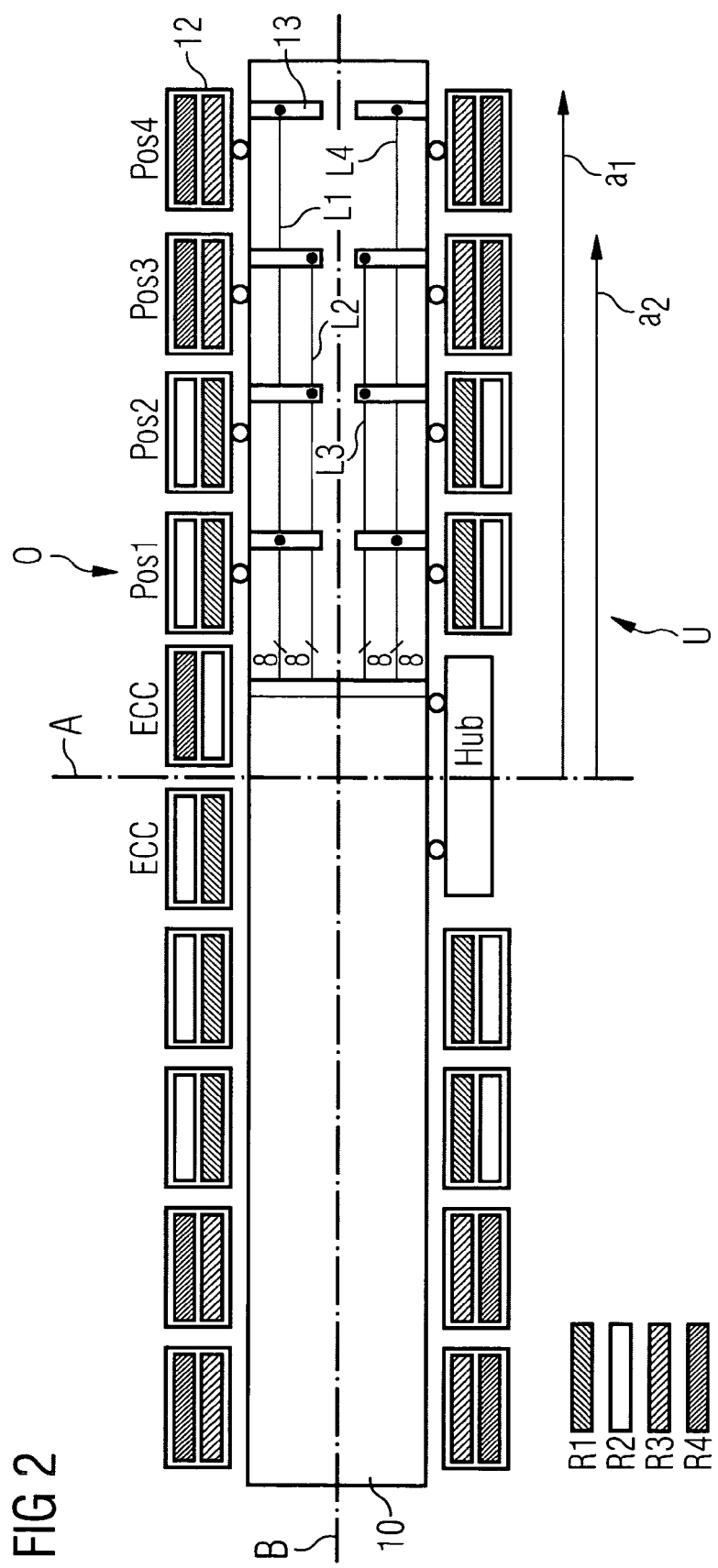

In another exemplary embodiment of a memory module according to the invention, shown in FIG. 2, the arrangement of the memory chip pairs or memory chips 12 on the wiring board 10 is, in principle, the same as in the first exemplary embodiment shown in FIG. 1 and explained above. In distinction from the first exemplary embodiment, the memory chips 12 in the first and fourth position Pos1, Pos4 are in each case connected on the top and bottom O, U and to the left and to the right of the plane of symmetry A to a first, fourth, fifth and eighth data line run (only the right-hand part of the semiconductor memory module is shown due to the symmetry with respect to the plane of symmetry A). In addition, the memory chip pairs or memory chips 12 in the second and third position Pos2, Pos3 are in each case connected on the top and bottom O, U and to the left and to the right of the center axis of symmetry A in each case to a second, third, sixth and seventh data line run, the first and fourth data line run L1 and L4 and the fifth and eighth data line run (not shown) in each case having a virtual length a1 and a second and third data line run L2, L3 and the sixth and seventh data line run, not shown, in each case having a virtual length a2.

Table 2 in FIG. 9 shows for the second exemplary embodiment described above, the arrangement of the memory chips 12 in positions Pos1–Pos4, the distribution of the ranks R1, R2, R3, R4, the connection of the memory chips in each case to the 8-bit-wide DQ line runs L1, L2, L3 and L4 on the top O and bottom U on the right-hand side, i.e., to the right of the center plane of symmetry A of the wiring board 10 in table form.

Table 2 shows in the second exemplary embodiment of the semiconductor module, that there is also a symmetry of the arrangement and of the connection to the data line runs with respect to the longitudinal plane of symmetry B. Furthermore, the semiconductor memory module illustrated in FIG. 2 has the same advantages as the first exemplary embodiment illustrated by FIG. 1 since a "loaded transmission line" concept is implemented and no vias passing through the entire wiring board 10 are needed.

Figure 3:
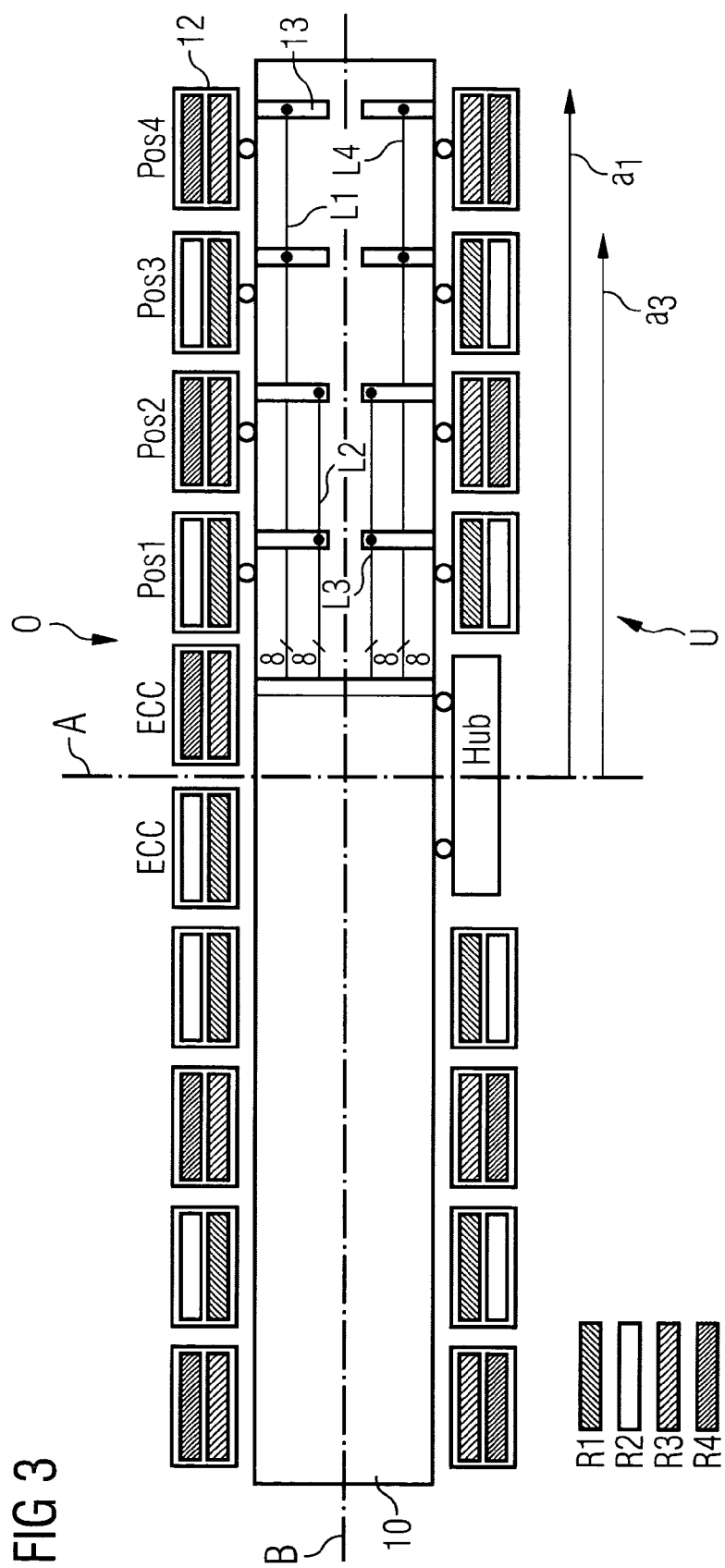

In the third exemplary embodiment of a semiconductor memory module according to the invention, illustrated in FIG. 3, the arrangement of the memory chips 12 is changed compared with the first and second exemplary embodiments shown in FIGS. 1 and 2. According to FIG. 3 namely, the memory chip pairs of the memory chips 12 are in each case arranged on the top O and bottom U of the wiring board 10 to the left and to the right of the center plane of symmetry A dividing the wiring board 10 into two identical halves, in such a manner that on the top and bottom O, U in the first and third position Pos1, Pos2, in each case one memory chip pair 12 of the first and second rank R1, R2 is located and in the second and fourth position Pos2, Pos4 in each case one memory chip pair 12 of in each case the third and fourth rank R3, R4 is located, and the memory chips 12 in the third and fourth position Pos3, Pos4 on the top and bottom O, U and above and below the center plane of symmetry B are in each case connected to a first and fourth data line run, and to a fifth and eighth data line run (not shown) to the left of the center plane of symmetry A. In addition, the memory chip pairs or memory chips 12 in the first and second position Pos1, Pos2 on the top and bottom O, U and to the left and to the right of the center plane of symmetry A of the wiring board 10 are in each case connected to a second and third data line run L2, L3 and to a sixth and seventh data line run (not shown) to the left of the center plane of symmetry A.

Table 3 in FIG. 10 shows, for the third exemplary embodiment shown in FIG. 3, the arrangement of the memory chip pairs or memory chips 12 in each case in positions Pos1–Pos4, the distribution of the ranks R1–R4 and the connection of the memory chip pairs to the individual 8-bit-wide DQ line runs L1–L4 in each case on the top and bottom in table form. In this third exemplary embodiment too, the arrangement is symmetric with respect to the longitudinal plane of symmetry B. In the third exemplary embodiment, through-connections or vias are no longer needed according to FIG. 3, and, instead, it is possible to manage with blind-hole connections 13 since a respective DQ line run can be routed on one side, i.e., the top or bottom of the semiconductor memory module.

According to FIG. 4, which diagrammatically illustrates a fourth exemplary embodiment (only the part of the semiconductor memory module located to the right of the center plane of symmetry A has been shown for simplification), eight ranks R1–R8 are distributed such that a data line run (8 bits wide) L1, L2 and, respectively, L3, L4 can be conducted on one side, i.e., the top O or the bottom U of the wiring board 10. As a result, a through-via between the top O and the bottom U is no longer needed. If a data line run L1, L2 and L3, L4 can be run on the surface of the top or bottom, a blind-hole connection is no longer needed. If the data line run L1, L2 and L3, L4 is conducted on the inner signal layers, a blind-hole connection 13 with relatively lower parasitic capacitances is sufficient. In the exemplary embodiment shown in FIG. 4, the eight ranks are in each case divided over the second and fourth position Pos2, Pos 4 and the first and third position Pos1, Pos3. In this arrangement, the memory chips in the second and fourth position Pos2, Pos4 are connected by a first data line run L1 and the memory chips in the first and third position Pos1, Pos3 are connected by a second data line run L2 on the top O of the wiring board 10, whereas the memory chips in the first and third position Pos1, Pos3 are connected by a third data line run L3 and the memory chips in the second and fourth position Pos2, Pos4 are connected by a fourth data line run L4 on the bottom U.

In the fifth exemplary embodiment shown in FIG. 5, which is a variant of the exemplary embodiment shown in FIG. 4, the eight ranks R1–R8 are in each case divided over the first and fourth position Pos1, Pos4 and the second and third position Pos2, Pos3, and on the top O of the wiring board 10, the memory chips in the first and fourth position Pos1, Pos4 are connected by a first data line run L1 and the memory chips in the second and third position are connected by a second data line run L2, whereas the memory chips on the bottom U of the wiring board 10 in the second and third position Pos2, Pos3 are connected by a third data line run L3 and those in the first and fourth position are connected by a fourth data line run L4.

Since the side located to the left of the center plane of symmetry A is symmetric to the right-hand side, what has been described above correspondingly applies to the fifth to eighth data line run L5–L8 (not shown) (compare FIG. 1). What has been described previously with regard to the through-vias between top and bottom and the possible omission of blind hole connections also applies to the left-hand side, not shown, of the fifth exemplary embodiment shown in FIG. 5.

In the sixth exemplary embodiment shown in FIG. 6, the eight ranks R1–R8 are in each case divided over the first and second position Pos1, Pos2 and the third and fourth position Pos3, Pos4. On the top O of the wiring board 10, a first data line run L1 connects the memory chips in the third and fourth position Pos3, Pos4 and a second data line run L2 connects the memory chips in the first and second position, whereas on the bottom U, a third data line run connects the memory chips in the first and second position and a fourth data line run L4 connects the memory chips in the third and fourth position Pos3, Pos4. Since the sixth exemplary embodiment shown in FIG. 6 also is a variant of the fourth and fifth exemplary embodiment shown in FIGS. 4 and 5, what has been described above correspondingly applies to the left-hand side (not shown) of the semiconductor memory module.

Figure 7B:
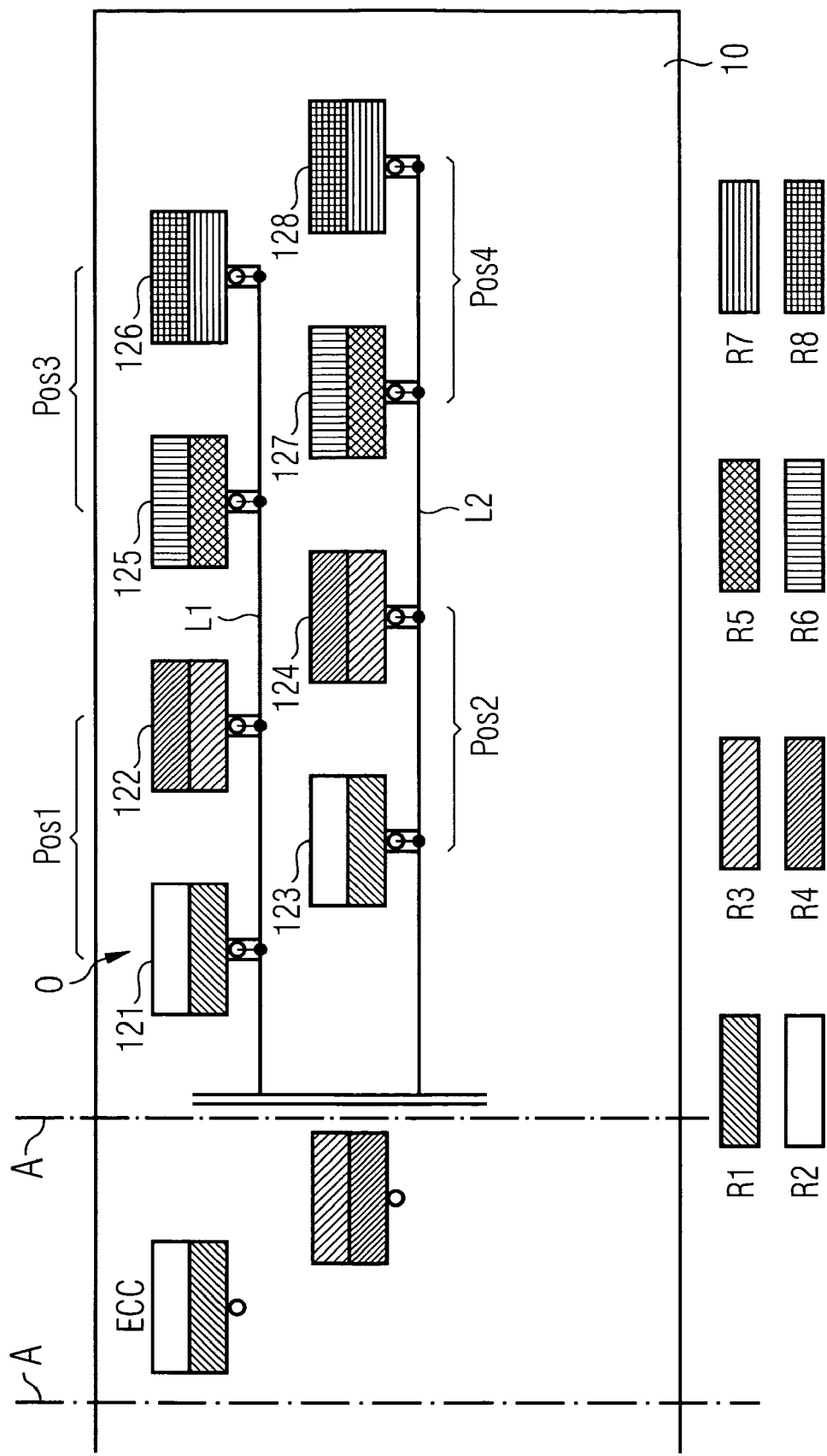

The seventh exemplary embodiment of a semiconductor memory module according to the invention, shown diagrammatically in FIGS. 7A (in a side view) and 7B (in a top view) also distributes eight ranks R1–R8 in each case on the top and bottom O and U of the wiring board 10 along the associated data line runs L1–L4 (L5–L8, not shown, on the left-hand side of the plane of symmetry A), so that, in operation, the load is distributed along the respective data line run. In deviation from the fourth to sixth exemplary embodiments, shown in FIGS. 4 to 6, not four but only two semiconductor memory chips are stacked above one another in a memory chip in the concept shown in FIGS. 7A and 7B. Compared with four memory chips being stacked in one memory chip, this concept achieves better heat distribution. The seventh exemplary embodiment shown in FIGS. 7A and 7B specifies one of a number of variants of the distribution of memory chips having two stacked memory chips, and thus of the memory ranks, along the associated data line run because, similarly to the fourth to sixth exemplary embodiment (compare FIGS. 4–6), the arrangement of the memory chips in the four positions Pos1–Pos4 can be varied whilst retaining the effect of load distribution in operation along the respective data line run.

Referring to FIGS. 7A and 7B, it is shown that on the top and bottom O, U of the wiring board 10 to the left and to the right of a center plane of symmetry A, dividing the former into two symmetric halves, in each case a first to fourth position Pos1, Pos2, Pos3, Pos4 are provided for the memory chips 12 in this order, beginning from the center plane of symmetry A, and on the top and bottom O, U, in the first and second position Pos1, Pos2, in each case a first, second, third and fourth memory chip 121, 123, 124 with in each case two memory chips and, in the third and fourth position Pos3, Pos4, in each case a fifth, sixth, seventh and eighth memory chip 125, 126, 127, 128 having in each case two memory chips are arranged.

As shown, the distribution of the eight ranks R1–R8 in the seventh exemplary embodiment according to FIGS. 7A and 7B is such that on the wiring board 10, the first and third memory chip 121, 123 in each case have two memory chips of first and second rank R1, R2 and are arranged in each case to the side next to the second and fourth memory chip 122, 124 in each case exhibiting two memory chips of third and fourth rank R3, R4, whereas the fifth and seventh memory chip 125, 127 in each case exhibit two memory chips of fifth and sixth rank R5, R6 and are in each case arranged to the side next to the sixth and eighth memory chip 126, 128 exhibiting in each case two memory chips of the seventh and eighth rank R7, R8, the first, second, fifth and sixth memory chips 121, 122, 125, 126 on the top and bottom O, U and to the left and to the right of the center plane of symmetry A being connected in each case by a first, fourth, fifth and eighth data line run L1, L4, L5, L8 and the third, fourth, seventh and eighth memory chips 123, 124, 127, 128 on the top and bottom O, U and to the left and to the right of the center plane of symmetry A in each case being connected by a second, third, sixth and seventh data line run L2, L3, L6, L7.

For the exemplary embodiments described above, it holds true that, if the data line runs can be routed on the outside of the wiring board (top or bottom), neither vias nor blind holes are needed.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference designations | |
|---|---|
| 1, 10 | DIMM module, wiring board |
| 2 | Vias |
| 3 | Junction points |
| 4, 11 | Hub |
| 5, 12, 121–128 | Memory chips |
| 13 | Blind-hole connections |
| L1–L8 | Data signal line runs |
| Pos1–Pos4 | Assembly positions on the DIMM module |
| A, B | Planes of symmetry |
| ECC | ECC chips |
| O, U | Top and bottom of the DIMM module |
| a1, a2, a3 | Virtual length of data line runs |
| R1–R8 | Memory ranks |

What is claimed is:

1. A semiconductor memory module comprising:
a wiring board, the wiring board having a plurality of data line runs disposed therein or thereon, in a respective width of k bits, the wiring board exhibiting a number of the data line runs conducting memory ranks, the memory ranks including n memory chips;
at least one signal driver/control chip (hub); and
one of the plurality of k-bit-wide data line run connecting a memory chip from each memory rank to the signal driver/control chip (hub),
wherein the memory ranks are distributed on the top and bottom of the wiring board along the associated data line run such that, in operation, the load is distributed along the respective data line run.

2. The semiconductor memory module as claimed in claim 1, wherein the semiconductor memory module is a DIMM semiconductor memory module and the memory chips are DRAM chips.

3. The semiconductor memory module as claimed in claim 1, wherein k=8, n=8, the number of data line runs is 8, and the semiconductor memory module has four ranks.

4. The semiconductor memory module as claimed in claim 1, wherein k=8, n=8, the number of data line runs is 8, and the semiconductor memory module has eight ranks.

5. The semiconductor memory module as claimed in claim 1, wherein the memory chips on the top and bottom of the wiring board are arranged in a number of positions, each of the positions being the same distance from one another, the same number of memory chips forming memory chips of in each case different ranks being stacked above one another on the top and bottom in each position and the memory chips of a respective memory chip being connected to the same data line run.

6. The semiconductor memory module as claimed in claim 4, wherein four memory chips are stacked in each memory chip.

7. The semiconductor memory module as claimed in claim 3, wherein two memory chips are stacked in each memory chip.

8. The semiconductor memory chip as claimed in claim 1, wherein the arrangement of the memory chips on the top and bottom of the wiring board is selected such that a respective data line run is conducted either only on the top or only on the bottom of the wiring board, there being no vias to the other side of the wiring board for the respective data line run.

9. The semiconductor memory module as claimed in claim 8, wherein the arrangement and distribution of the memory ranks are selected such that an input capacitance of a memory chip is used for impedance matching of the respective line of the data line run.

10. The semiconductor memory module as claimed in claim 7, wherein a first to fourth position are provided for the memory chips in order, beginning from the center plane of symmetry on the top and bottom of the wiring board to the left and to the right of a plane of symmetry dividing the wiring board into two symmetric halves, and on the top and bottom in the first and second position, in each case, one memory chip with a memory chip pair of the first and second rank, and in the third and fourth position in each case one memory chip with a memory chip pair of the third and fourth rank are arranged.

11. The semiconductor memory module as claimed in claim 10, wherein the memory chips in the second and fourth position, on the top and bottom and to the left and to the right of the center plane of symmetry of the wiring board are connected to a first, fourth, fifth and eighth data line run and, in addition, the memory chips in the first and third position on the top and bottom and to the left and to the right of the center plane of symmetry of the wiring board are connected to a second, third, sixth and seventh data line run.

12. The semiconductor memory module as claimed in claim 10, wherein the memory chips in the first and fourth position on the top and bottom and to the left and to the right of the center plane of symmetry of the wiring board are in each case connected to a first, fourth, fifth and eighth data line run and, in addition, the memory chips in the second and third position on the top and bottom and to the left and to the right of the center plane of symmetry of the wiring board are in each case connected to a second, third, sixth and seventh data line run.

13. The semiconductor memory module as claimed in claim 7, wherein on the top and bottom of the wiring board to the left and to the right of a plane of symmetry dividing the former into two symmetric halves, in each case a first to fourth position are provided for the memory chips in this order, beginning from the center plane of symmetry,
on the top and bottom in the first and third position, one memory chip with a memory chip pair of the first and second rank and, in the second and fourth position, one memory chip with a memory chip pair in each case of the third and fourth rank are arranged, and
the memory chips of the memory chips in the third and fourth position on the top and bottom and to the left and to the right of the center plane of symmetry are in each case connected to a first, fourth, fifth and eighth data line run and, in addition, the memory chip pairs of the memory chips in the first and second position on the top and bottom and to the left and to the right of the center plane of symmetry are in each case connected to a second, third, sixth and seventh data line run.

14. The semiconductor memory module as claimed in claim 6, wherein, on the top and bottom of the wiring board to the left and to the right of a plane of symmetry dividing the former into two symmetric halves, in each case a first to fourth position are provided for the memory chips in this order, beginning from the center plane of symmetry, and on the top and bottom, either
  a) in the first and second position in each case one memory chip with in each case four memory chips of the first, second, third and fourth rank and in the third and fourth position, in each case one memory chip with in each case four memory chips of the fifth, sixth, seventh and eighth rank are arranged, or
  b) in the first and third position, in each case one memory chip with in each case four memory chips of the first, second, third and fourth rank and, in the second and fourth position, in each case one memory chip with in each case four memory chips of the fifth, sixth, seventh and eighth rank are arranged.

15. The semiconductor memory module as claimed in claim 14, wherein, in alternative a),
the memory chips, including eight ranks, of the memory chips in the second and fourth position on the top and bottom of the wiring board and to the left and to the right of the center plane of symmetry are in each case connected to a first, fifth, fourth and eighth data line run and the memory chips, including eight ranks of the memory chips in the first and third position on the top and bottom of the wiring board and to the left and to the right of the center plane of symmetry are in each case connected to a second, third, sixth and seventh data line run.

16. The semiconductor memory module as claimed in claim 14, wherein, in alternative b),
the memory chips, including eight ranks of the memory chips in the first and fourth position on the top and bottom and to the left and to the right of the center plane of symmetry of the wiring board are in each case connected to a first, fourth, fifth and eighth data line run and, in addition, the memory chips, including eight ranks, of the memory chips in the second and third position on the top and bottom and to the left and to the right of the center plane of symmetry are in each case connected to a second, third, sixth and seventh data line run.

17. The semiconductor memory module as claimed in claim 14, wherein, in alternative b),
the memory chips, including eight ranks, of the memory chips in the third and fourth position on the top and bottom and to the left and to the right of the center plane of symmetry of the wiring board are connected to a first, fourth, fifth, and eighth data line run and,
the memory chips having eight ranks of the memory chips of the first and second position on the top and bottom and to the left and to the right of the center plane of symmetry are connected to a second, third, sixth and seventh data line run.

18. The semiconductor memory module as claimed in claim 4, wherein on the top and bottom f the wiring board to the left and to the right of a plane of symmetry dividing the former into two symmetric halves, in each case a first to fourth position are provided for the memory chips in this order, beginning from the center plane of symmetry, and, on the top and bottom in the first and second position, in each case a first, second, third and fourth memory chip with two memory chips are arranged and in the third and fourth position in each case a fifth, sixth, seventh and eighth memory chip with two memory chips are arranged.

19. The semiconductor memory module as claimed in claim 18, wherein on the wiring board the first and third memory chip have two memory chips of the first and second rank and are arranged to the side and next to the second and fourth memory chip having two memory chips of the third and fourth rank whereas the fifth and seventh memory chip case have two memory chips of the fifth and sixth rank and are arranged to the side and next to the sixth and eighth memory chip having two memory chips of the seventh and eighth rank, the first, second, fifth, and sixth memory chips on the top and bottom and to the left and to the right of the center plane of symmetry being connected by a first, fourth, fifth, and eighth data line run and third, fourth, seventh and eighth memory chips on the top and bottom and to the left and to the right of the center plane of symmetry connected by a second, third, sixth, and seventh data line run.

20. The semiconductor memory module as claimed in claim 5, wherein four memory chips are stacked in each memory chip.

21. The semiconductor memory module as claimed in one of claim 4, wherein two memory chips are stacked in each memory chip.

22. The semiconductor memory module as claimed in one of claim 5, wherein two memory chips are stacked in each memory chip.

23. The semiconductor memory module as claimed in claim 8, wherein in each case a first to fourth position are provided for the memory chips in order, beginning from the center plane of symmetry on the top and bottom of the wiring board to the left and to the right of a plane of symmetry dividing the wiring board into two symmetric halves, and on the top and bottom in the first and second position, in each case one memory chip with a memory chip pair in each case of the first and second rank and in the third and fourth position in each case one memory chip with a memory chip pair in each case of the third and fourth rank are arranged.

24. The semiconductor memory module as claimed in claim 8, wherein on the top and bottom of the wiring board to the left and to the right of a plane of symmetry dividing the former into two symmetric halves, in each case a first to fourth position are provided for the memory chips in order, beginning from the center plane of symmetry, on the top and bottom in the first and third position, in each case one memory chip with a memory chip pair in each case of the first and second rank and, in the second and fourth position, in each case one memory chip with a memory chip pair in each case of the third and fourth rank are arranged, and the memory chips of the memory chips in the third and fourth position on the top and bottom and to the left and to the right of the center plane of symmetry are in each case connected to a first, fourth, fifth and eighth data line run and, in addition, the memory chip pairs of the memory chips in the first and second position on the top and bottom and to the left and to the right of the center plane of symmetry are in each case connected to a second, third, sixth and seventh data line run.

25. The semiconductor memory module as claimed in claim 8, wherein, on the top and bottom of the wiring board to the left and to the right of a plane of symmetry dividing the former into two symmetric halves, in each case a first to fourth position are provided for the memory chips in this order, beginning from the center plane of symmetry, and on the top and bottom, either a) in the first and second position in each case one memory chip with in each case four memory chips of the first, second, third and fourth rank and in the third and fourth position, in each case one memory chip with in each case four memory chips of the fifth, sixth, seventh and eighth rank are arranged, or b) in the first and third position, in each case one memory chip with in each case four memory chips of the first, second, third and fourth rank and, in the second and fourth position, in each case one memory chip with in each case four memory chips of the fifth, sixth, seventh and eighth rank are arranged.

26. The semiconductor memory module as claimed in claim 25, wherein, in alternative a),
the memory chips, including eight ranks, of the memory chips in the second and fourth position on the top and bottom of the wiring board and to the left and to the right of the center plane of symmetry are in each case connected to a first, fifth, fourth and eighth data line run and the memory chips, including eight ranks of the memory chips in the first and third position on the top and bottom of the wiring board and to the left and to the right of the center plane of symmetry are in each case connected to a second, third, sixth and seventh data line run.

27. The semiconductor memory module as claimed in claim 25, wherein, in alternative b),
the memory chips, including eight ranks of the memory chips in the first and fourth position on the top and bottom and to the left and to the right of the center plane of symmetry of the wiring board are in each case connected to a first, fourth, fifth and eighth data line run and, in addition, the memory chips, including eight ranks, of the memory chips in the second and third position on the top and bottom and to the left and to the right of the center plane of symmetry are in each case connected to a second, third, sixth and seventh data line run.

28. The semiconductor memory module as claimed in claim 25, wherein, in alternative b),
the memory chips, including eight ranks, of the memory chips in the third and fourth position on the top and bottom and to the left and to the right of the center plane of symmetry of the wiring board are connected to a first, fourth, fifth, and eighth data line run and,
the memory chips having eight ranks of the memory chips of the first and second position on the top and bottom and to the left and to the right of the center plane of symmetry are connected to a second, third, sixth and seventh data line run.

29. The semiconductor memory module as claimed in claim 5, wherein on the top and bottom of the wiring board to the left and to the right of a plane of symmetry dividing the former into two symmetric halves, in each case a first to fourth position are provided for the memory chips in this order, beginning from the center plane of symmetry, and, on the top and bottom in the first and second position, in each case a first, second, third and fourth memory chip with two memory chips are arranged and in the third and fourth position in each case a fifth, sixth, seventh and eighth memory chip with two memory chips are arranged.

30. The semiconductor memory module as claimed in claim 7, wherein on the top and bottom of the wiring board to the left and to the right of a plane of symmetry dividing the former into two symmetric halves, in each case a first to fourth position are provided for the memory chips in this order, beginning from the center plane of symmetry, and, on the top and bottom in the first and second position, in each case a first, second, third and fourth memory chip with two memory chips are arranged and in the third and fourth position in each case a fifth, sixth, seventh and eighth memory chip with two memory chips are arranged.

31. The semiconductor memory module as claimed in claim 8, wherein on the top and bottom of the wiring board to the left and to the right of a plane of symmetry dividing the former into two symmetric halves, in each case a first to fourth position are provided for the memory chips in this order, beginning from the center plane of symmetry, and, on the top and bottom in the first and second position, in each case a first, second, third and fourth memory chip with two memory chips are arranged and in the third and fourth position in each case a fifth, sixth, seventh and eighth memory chip with two memory chips are arranged.

32. The semiconductor memory module as claimed in claim 29, wherein on the wiring board the first and third memory chip have two memory chips of the first and second rank and are arranged to the side and next to the second and fourth memory chip having two memory chips of the third and fourth rank whereas the fifth and seventh memory chip case have two memory chips of the fifth and sixth rank and are arranged to the side and next to the sixth and eighth memory chip having two memory chips of the seventh and eighth rank, the first, second, fifth, and sixth memory chips on the top and bottom and to the left and to the right of the center plane of symmetry being connected by a first, fourth, fifth, and eighth data line run and third, fourth, seventh and eighth memory chips on the top and bottom and to the left and to the right of the center plane of symmetry connected by a second, third, sixth, and seventh data line run.

33. The semiconductor memory module as claimed in claim 30, wherein on the wiring board the first and third memory chip have two memory chips of the first and second rank and are arranged to the side and next to the second and fourth memory chip having two memory chips of the third and fourth rank whereas the fifth and seventh memory chip case have two memory chips of the fifth and sixth rank and are arranged to the side and next to the sixth and eighth memory chip having two memory chips of the seventh and eighth rank, the first, second, fifth, and sixth memory chips on the top and bottom and to the left and to the right of the center plane of symmetry being connected by a first, fourth, fifth, and eighth data line run and third, fourth, seventh and eighth memory chips on the top and bottom and to the left and to the right of the center plane of symmetry connected by a second, third, sixth, and seventh data line run.

34. The semiconductor memory module as claimed in claim 31, wherein on the wiring board the first and third memory chip have two memory chips of the first and second rank and are arranged to the side and next to the second and fourth memory chip having two memory chips of the third and fourth rank whereas the fifth and seventh memory chip case have two memory chips of the fifth and sixth rank and are arranged to the side and next to the sixth and eighth memory chip having two memory chips of the seventh and eighth rank, the first, second, fifth, and sixth memory chips on the top and bottom and to the left and to the right of the center plane of symmetry being connected by a first, fourth, fifth, and eighth data line run and third, fourth, seventh and eighth memory chips on the top and bottom and to the left and to the right of the center plane of symmetry connected by a second, third, sixth, and seventh data line run.

* * * * *